US006774537B2

(12) United States Patent
Titschert et al.

(10) Patent No.: US 6,774,537 B2
(45) Date of Patent: Aug. 10, 2004

(54) WARNING TONE TRANSMITTER

(75) Inventors: Jens Titschert, Lunen (DE); Jorg Wagner, Lunen (DE); Emmanuel Charruau, Lunen (DE); Helmut Hermann, Bochum (DE)

(73) Assignee: DBT Automation GmbH, Lunen (DE)

(*) Notice: Subject to any disclaimer, the term of this patent is extended or adjusted under 35 U.S.C. 154(b) by 89 days.

(21) Appl. No.: 10/260,842

(22) Filed: Sep. 30, 2002

(65) Prior Publication Data

US 2003/0062992 A1 Apr. 3, 2003

(30) Foreign Application Priority Data

Sep. 29, 2001 (DE) ........................................ 101 48 303

(51) Int. Cl.[7] ................................................ H01L 41/02
(52) U.S. Cl. ................................................ 310/323.17
(58) Field of Search ................................ 310/324, 316, 310/317, 323.18–323.19, 384

(56) References Cited

U.S. PATENT DOCUMENTS

| | | | | |
|---|---|---|---|---|
| 3,569,963 A | * | 3/1971 | Mallory et al. | 340/384.7 |
| 3,860,838 A | * | 1/1975 | Kumon | 310/322 |
| 3,890,612 A | * | 6/1975 | Sweany et al. | 310/317 |
| 3,922,672 A | * | 11/1975 | Birt et al. | 340/384.6 |
| 4,225,856 A | * | 9/1980 | Learn | 340/384.72 |
| 4,486,742 A | * | 12/1984 | Kudo et al. | 310/324 |
| 4,600,851 A | | 7/1986 | Isayama et al. | |
| 4,798,990 A | * | 1/1989 | Henoch | 310/334 |
| 6,166,624 A | | 12/2000 | Hurst | |

FOREIGN PATENT DOCUMENTS

| | | |
|---|---|---|
| DE | 27 02 381 A1 | 7/1977 |
| DE | 31 38 068 C2 | 7/1982 |
| DE | 34 14 722 A1 | 11/1984 |
| DE | 43 10 168 A1 | 10/1993 |
| DE | 43 11 701 A1 | 10/1994 |
| DE | 195 30 529 A1 | 2/1997 |
| GB | 2 265 712 A | 10/1993 |

* cited by examiner

*Primary Examiner*—Thomas M. Dougherty
*Assistant Examiner*—Karen Addison
(74) *Attorney, Agent, or Firm*—Cook, Alex, McFarron, Manzo, Cummings & Mehler, Ltd.

(57) ABSTRACT

The warning tone transmitter (10) according to the invention has a piezoelectric horn element (12) with two input connectors (29, 30) for the application of the supply voltage at a determined frequency and has a circuit arrangement (14) fed from the current supply, which generates the supply voltage. In order to be able to receive confirmation that the horn signal is actually generated by the warning tone transmitter (10) and in order to be able more easily to calibrate the warning tone transmitter (10) such that it is driven at its resonant frequency the piezoelectric horn element (12) has an additional output connector (34), which, when the horn element (12) is fed with the supply voltage, generates an answering signal taken to the circuit arrangement (14) if the piezoelement is actually oscillating. The magnitude of the answering signal is a value for the sound volume of the warning tone transmitter (10).

12 Claims, 2 Drawing Sheets

WARNING TONE TRANSMITTER

BACKGROUND OF THE INVENTION

The present invention relates to a warning tone transmitter for application in underground mining, with a piezoelectric horn element with two input connections for the application of a supply voltage at a determined frequency and with a circuit arrangement fed from a supply current to generate the supply voltage.

In the course of the mining of the raw materials to be mined, such as coal, the advancing support frames finding application in underground mining are regularly withdrawn, moved forward in the direction of the mining face and then set in place again. It is important in this process that no mining personnel are present in the danger area, whereby various safety measures ensure that during the withdrawing, advancing and setting process of one or more advancing support frames nobody is injured.

One of these safety measures, which are provided on all support frames and are coupled to and activated by the advancing support frame controllers, are warning tones, which are activated before the start of the withdrawing process and generate a sufficiently long and loud warning tone, so as to alert miners working in the neighbourhood of the advancing support frame immediately before the withdrawing process to the danger resulting from this.

The previously proposed warning tone transmitters, which have previously been used for this have a piezoelectric horn element with two connections to which a supply voltage is fed, whereby the supply voltage has a frequency which corresponds to the tone generated by the horn. Since the loudest possible warning noise must be generated by the warning tone transmitter, it is endeavoured to bring the frequency of the supply voltage into agreement with the resonant frequency of the horn element in its assembled condition, since in the resonant case the sound volume obtainable from the warning tone transmitter is the greatest possible.

The aim of driving the known warning tone generators with their resonant frequency has in practice not been achievable. Since not only do the piezoelectric horn elements differ somewhat in their resonant frequency, but the resonant frequency of the horn element in its assembled condition depends also on the assembly conditions such as for instance the torque applied to screw fasteners or similar and the spatial environment of the warning tone transmitter also has a not inconsiderable influence on the resonant frequency, the sound volume at which the known warning tone transmitters which the known warning tone transmitters generate their warning tone is generally lower than would theoretically be possible. A further disadvantage of the known warning tone transmitter is that the controller of the support frame has no possibility of establishing whether a warning tone is actually being generated by the horn.

SUMMARY OF THE INVENTION

It is an aim of the present invention to produce a warning tone transmitter of the construction mentioned in the opening paragraph of the present specification, which can be driven in a simple manner at the resonant frequency, and thereby at its greatest possible sound volume, and which makes it possible to give the controller of the support frame an confirmation signal on the successful triggering of the horn signal.

Accordingly the present invention is directed to a warning tone transmitter as described in the opening paragraph of the present specification, in which the piezoelectric horn element has an additional output connection, which on the feeding of the horn element with the supply voltage generates an answering voltage signal which is taken to the circuit arrangement, and which is a value for the sound volume of the warning tone transmitter.

Using the third connection provided on the horn element it is possible to generate an actual signal, with whose help the calibration of the circuit arrangement is easily possible such that the voltage generated by it has a frequency which corresponds to the resonant frequency of the warning tone transmitter. The present invention makes use of the knowledge that the answering signal on the output connection, which is induced by the oscillation of the piezoelectric horn element and which consequently has a frequency which corresponds to the oscillatory frequency of the piezoelement and thus the frequency of the supply voltage, will assume a maximum value of voltage, when the horn is driven in resonance. It is only thus necessary for the calibration of the warning tone transmitter to vary the frequency of the supply voltage and at the same time to observe the answering signal and to adjust the supply voltage frequency to a value at which the signal delivered by the answering signal is a maximum. Such a measurement and calibration can be effected with very simple means. The answering voltage signal is in any case only generated when the piezoelement is actually oscillating and therefore generates a warning tone; the lack of an answering signal thus indicates that the warning tone transmitter has not generated the intended warning tone and the command for withdrawal and advancing of the support frame is not issued.

Advantageously the circuit arrangement has a self calibration arrangement for the supply voltage frequency, the circuit arrangement thus itself calculates the frequency at which the output voltage signal is a maximum. Such a self calibration can be effected by comparison measurements, preferably the self calibration device to work on successive approximations. In this procedure the required store for intermediate storage of the measured values is relatively lightly loaded and a fast and very precise calibration is achieved.

Preferably the circuit arrangement has a frequency generator to generate and change the supply voltage frequency. In a preferred embodiment the horn element is arranged in a preferably cylindrical horn casing and retained by a securing element which, for instance, can comprise a screw insert. It is also possible to use an O-ring or a circlip as the securing element. Thus the assembly of the horn element in the horn casing is possible in a fast and reliable in production.

Advantageously the horn element has a carrier plate with a piezoelectric membrane arranged upon it with a feedback pin arranged at or on it onto which the output connector is joined. The feedback pin oscillates in common with the piezoelectric membrane, when it is fed with a supply voltage of determined frequency. As a result of this oscillation the feedback pin generates a voltage at the output connector whose frequency corresponds to the oscillating frequency of the membrane and whose magnitude varies with the amplitude of the membrane and thus with the sound volume of the horn.

Preferably circuit arrangement has control electronics in the form of a microcontroller, which has outputs for the supply voltage signals and inputs for the line voltage and for the answering signal. Preferably the circuit arrangement has a rectifier circuit connected between the control electronics and the output connector, which rectifies the answering signal, so that it can be more readily processed by the control electronics. In a preferred embodiment the supply voltage signals from the control electronics are amplified by means of amplifying circuits before they are taken to the input connectors, so that the control electronics itself has only a low power consumption.

Advantageously the horn element and the circuit arrangement are arranged in a common horn casing, which then following its installation in the place provided for it on the advancing support frame or similar only requires to be connected to the power supply and to the actuating connection for the horn.

BRIEF DESCRIPTION OF THE DRAWINGS

An example of a warning tone transmitter made in accordance with the present invention will now be described hereinbelow in relation to the accompanying drawings, evident from the following drawings in which.

Figure 1:
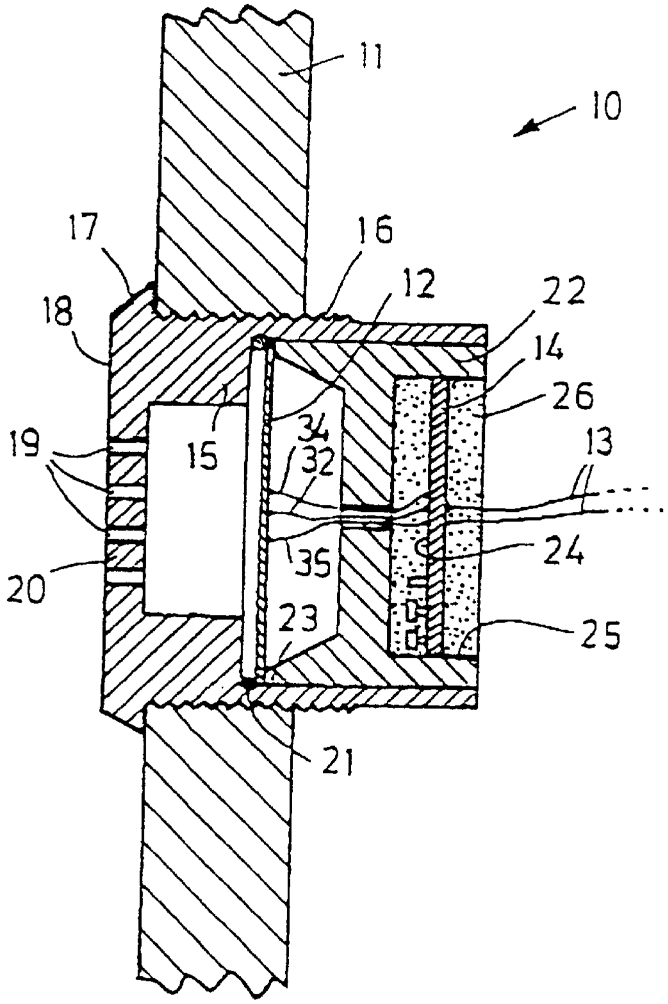
FIG. 1 shows a longitudinal section of a warning tone transmitter according to the present invention in an installed condition.

In the drawing, reference 10 denotes a warning tone transmitter, as finds application in advancing support frames (not shown) in underground miring, to warn the mining personnel with the loudest possible tone before the withdrawal, advancing and setting processes of a support frame.

The warning tone transmitter 10, which is shown in FIG. 1 in the installed condition on a casing wall 11, essentially comprises a piezoelectric horn element 12 and a circuit arrangement 14 connected to it by a connecting cable 13, whereby the circuit arrangement 14 and the horn element 12 are arranged in a common horn casing 15.

The horn casing 15 comprises plastics material and is formed somewhat pot or beaker shaped. It is provided on its outer circumference with a screw thread 16, with which it is screwed into an accepting boring in the casing wall 11. A forward collar 17 on the horn casing limits the depth of screwing into the accepting boring and caters for a defined position on the casing wall 11.

On its forward end 18 the horn casing is closed by a perforated plate 20 provided with sound openings 19. On the inner side of the perforated plate 20 is a narrow distance ring 21 made of rubber, e.g. an O-ring, onto which the horn element 12 abuts. A threaded insert 22 screwed into the horn casing 15 from the rear side caters for the securing of the horn element, and clamps the horn element 12 between a forward end 23 of the threaded insert 22 and the distance ring 21.

The circuit arrangement 14 is completely arranged on a circular board 24, which is inserted into a rear cylindrical cut-out 25 in the screwed insert 22 and secured in it by means of a hardening cast mass 26.

Figure 2:
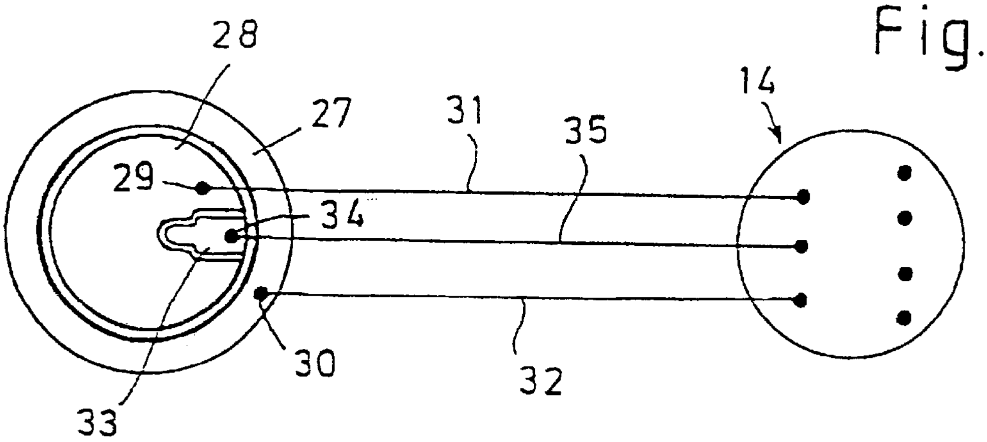
FIG. 2 shows a schematic representation of a piezoelectric horn element shown finding application in the warning tone transmitter and the circuit arrangement joined to it.

The piezoelectric horn element 12 and the circuit arrangement 14 are shown in a schematic plan view in FIG. 2. The horn element 12 comprises according to this a circular brass carrier plate 27, onto which a piezoelectric membrane 28 is arranged. The carrier plate 27 and the membrane 28 each has an input connector 29 and 30 via which the supply voltage from the circuit arrangement 14 is fed via the conductors 31, 32 to the horn element 12. The piezoelectric membrane 28 is provided with a feedback pin 33 arranged upon it, which has an output connector 34, which is connected to the circuit arrangement via a conductor 35.

Figure 3:
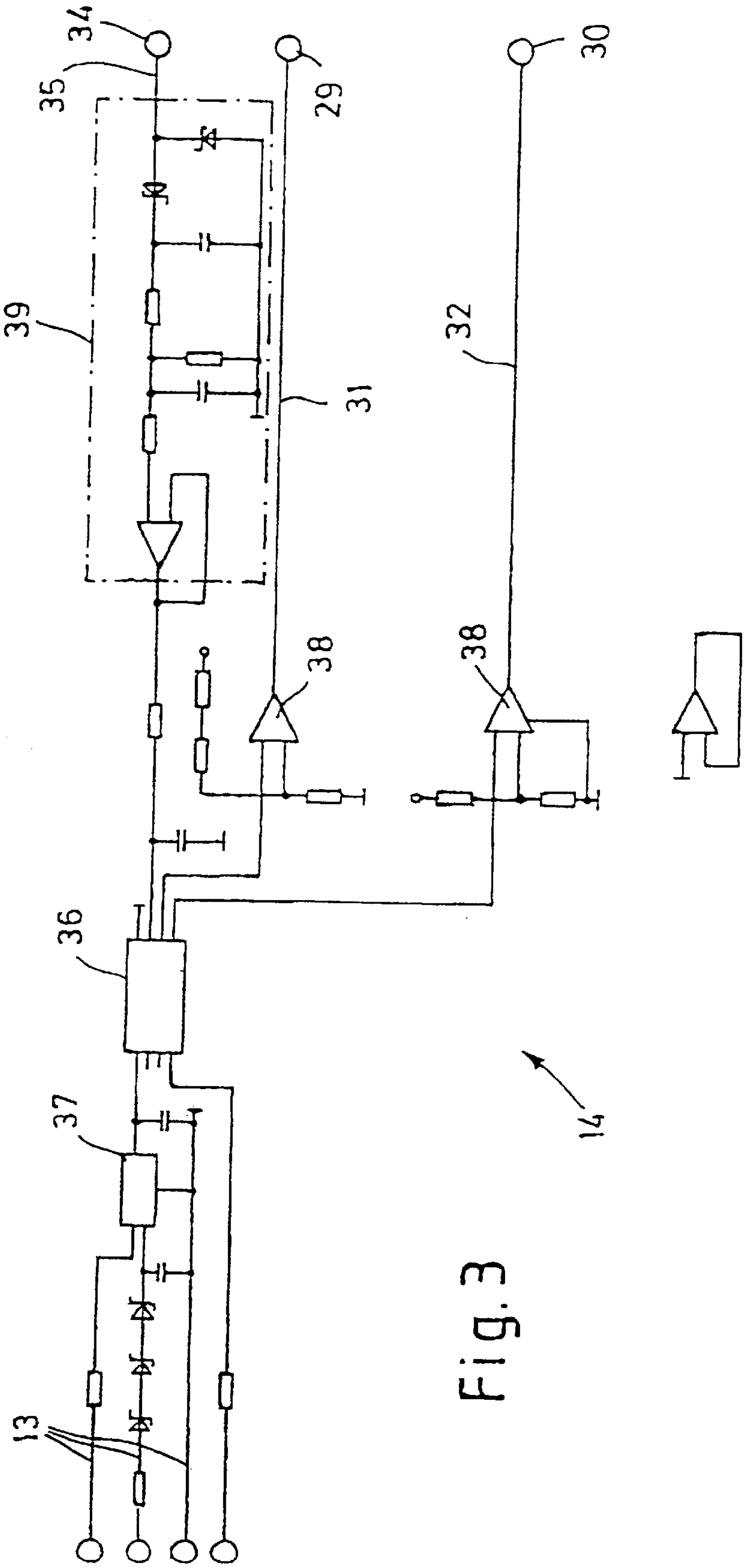
FIG. 3 shows a circuit diagram of the circuit arrangement for the warning tone generator.

The circuit diagram of the circuit arrangement, shown only schematically in FIG. 2, is shown in FIG. 3.

The circuit arrangement 14 has as its central component control electronics 36 in the form of a microcontroller, which is connected between a voltage regulator 37 for the connection voltage and two operational amplifiers 38, by which the output signals from the control electronics are amplified and fed to the input connectors 29, 30 of the horn element 12 via the conductors 31, 32.

A rectifier circuit 39 is provided between the output connector 34 and the microcontroller 36, which rectifies the output signal voltage appearing on the output connector 34 when the horn is actuated and feeds it in this processed form to the microcontroller as an actual value.

The method of operation of the horn is as follows:

The horn element 12 is fed via its input connectors 29, 30 with a supply voltage from the microcontroller which is supplied with the line voltage, after amplification by the operational amplifiers 38, which has a frequency, which before the first calibration of the horn can under some circumstances deviate noticeably from the resonance frequency. The piezoelectric membrane 28 is excited into oscillation by the supply voltage, whereby its frequency of oscillation corresponds to the frequency of the supply voltage. Its feedback pin 33 is also oscillated by the membrane at the same frequency as the supply voltage. It thereby generates an answering signal at the output connector 34, which has the same frequency as the supply signal, whereby the amplitude of the answering signal represents a value for the sound intensity of the horn and then accordingly reaches a maximum value when the horn is driven with its resonant frequency, at which it is at its loudest.

This answering signal voltage is rectified in the rectifier circuit 39 and then passed to the microcontroller 36. It provides first a confirmation that the horn has actually been activated, the mining personnel in the neighbourhood of the stepping support frame provided with the horn are thus warned, before it is withdrawn, driven forward and reset. The answering signal voltage however can also be applied for the calibration of the horn, whereby the calibration process can be initiated by the microcontroller in the preferred embodiment either at regular pre settable time intervals or manually.

For the calibration, whose objective is to adjust the supply voltage on the input connectors 29, 30 to the resonant frequency of the warning tone transmitter, the horn is driven sequentially according to the principle of successive approximation with different frequencies and for each supply voltage frequency the magnitude of the answering signal is obtained. To this end the microcontroller first generates a supply voltage at a determined starting frequency f1 and obtains the answering signal al associated with it. Then the horn is driven with higher and lower frequencies. It is thus sampled systematically about the starting value and it is established whether in the sequential measurements the answering signal has a higher value. If this is the case, further tests are performed about this new middle point, whereby the value of the steps of the individual measurements is continuously reduced. Thereby the microprocessor regulates the frequency of the supply voltage automatically to a value at which the answering signal is at its greatest.

This value, which essentially corresponds to the current resonant frequency of the warning tone transmitter, is stored in the microcontroller at the end of the calibration process and serves as the prescript for the frequency of the supply voltage until the next calibration.

Using the horn according to the invention a notable sound volume of 95 dB is achieved from the horn, with only a small line voltage of 12 Volt and only a low current consumption, since the warning tone transmitter is driven in a simple and precise manner in the region of its resonant frequency, at which it has the greatest sound volume. With the answering signal voltage the controller for the individual advancing support frame always receives a confirmation that the horn tone has actually been set off, before the withdrawal process is released for the stepping of the support frame. The new warning tone transmitter hereby significantly improves the safety of the mining personnel underground.

What is claimed is:

1. A warning tone transmitter for application in underground mining, with a piezoelectric horn element with two input connections for the application of a supply voltage at a determined frequency and with a circuit arrangement fed from a supply current to generate the supply voltage, in which the piezoelectric horn element has an additional output connection, which on the feeding of the horn element with the supply voltage generates an answering voltage signal which is taken to the circuit arrangement, and which is a value for the sound volume of the warning tone transmitter.

2. A warning tone transmitter according to claim 1, in which the circuit arrangement has a self calibration arrangement for the supply voltage frequency.

3. A warning tone transmitter according to claim 2, in which the self calibration arrangement can be activated by the expiry of a time limit.

4. A warning tone transmitter according to claim 2, in which the self calibration arrangement can be activated by an external signal.

5. A warning tone transmitter according to claim 1, in which the circuit arrangement has a frequency generator to generate and change the supply voltage frequency.

6. A warning tone transmitter according to claim 1, in which the horn element is arranged in a preferably cylindrical horn casing and is retained by means of a securing element.

7. A warning tone transmitter according to claim 4, in which the securing element comprises a threaded insert, an O-ring, a circlip or similar.

8. A warning tone transmitter according to claim 1, in which the horn element has a carrier plate with a piezoelectric membrane arranged upon it and with a feedback pin arranged at or on it onto which the output connector is joined.

9. A warning tone transmitter according to claim 1, in which the circuit arrangement has control electronics in the form of a microcontroller, which has outputs for the supply voltage signals and inputs for the line voltage and for the answering signal.

10. A warning tone transmitter according to claim 9, in which the circuit arrangement has a rectifier circuit connected between the control electronics and the output connector.

11. A warning tone transmitter according to claim 1, characterised in that the supply voltage signals from the control electronics are amplified by means of amplifier circuits before they are taken to the input connectors.

12. A warning tone transmitter according to claim 1, in which the horn element and the circuit arrangement are arranged in a common horn casing.

* * * * *